United States Patent
Mori

(10) Patent No.: US 9,171,948 B2
(45) Date of Patent: Oct. 27, 2015

(54) NONVOLATILE SEMICONDUCTOR STORAGE DEVICE AND FABRICATION METHOD THEREOF

(71) Applicant: Kabushiki Kaisha Toshiba, Tokyo (JP)

(72) Inventor: Shinji Mori, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/791,645

(22) Filed: Mar. 8, 2013

(65) Prior Publication Data
US 2013/0270621 A1    Oct. 17, 2013

(30) Foreign Application Priority Data
Apr. 16, 2012   (JP) .................................. 2012-092622

(51) Int. Cl.
*H01L 29/792*   (2006.01)
*H01L 29/78*   (2006.01)
*H01L 21/768*   (2006.01)
*H01L 27/115*   (2006.01)

(52) U.S. Cl.
CPC .......... *H01L 29/78* (2013.01); *H01L 21/76877* (2013.01); *H01L 27/1157* (2013.01); *H01L 27/11582* (2013.01); *H01L 29/7926* (2013.01)

(58) Field of Classification Search
CPC .................... H01L 27/11582; H01L 27/11578; H01L 21/823807; H01L 21/823842; H01L 27/11568
USPC ........... 257/315, 316; 438/216, 229, 270, 700
See application file for complete search history.

(56) References Cited

U.S. PATENT DOCUMENTS

| | | | | |
|---|---|---|---|---|
| 7,638,401 B2 * | 12/2009 | Nagata | ........................... | 438/301 |
| 8,017,993 B2 * | 9/2011 | Kidoh et al. | ................... | 257/324 |
| 8,114,300 B2 * | 2/2012 | Millward | ........................... | 216/2 |
| 8,174,890 B2 * | 5/2012 | Maeda et al. | ............ | 365/185.17 |
| 2004/0227179 A1 * | 11/2004 | Rabkin et al. | .................. | 257/315 |
| 2008/0217292 A1 | 9/2008 | Millward et al. | | |

(Continued)

FOREIGN PATENT DOCUMENTS

| | | |
|---|---|---|
| JP | 2010225946 A | 10/2010 |
| JP | 2011198806 | 10/2011 |
| JP | 2011198963 A | 10/2011 |

OTHER PUBLICATIONS

Ryota Katsumata et al.; "Pipe-shaped BiCS Flash Memory with 16 Stacked Layers and Multi-Level-Cell Operation for Ultra High Density Storage Devices"; 2009 Symposium on VLSI Technology Digest of Technical Papers; 2009; pp. 16-18.

(Continued)

*Primary Examiner* — Jaehwan Oh
(74) *Attorney, Agent, or Firm* — Patterson & Sheridan, LLP

(57) ABSTRACT

A nonvolatile semiconductor storage device has a plurality of memory strings in which electrically rewritable memory cells are connected in series. The memory strings have word-line electroconductive layers laminated at a prescribed interval to sandwich an interlayer insulating film onto a semiconductor substrate and through holes that penetrate through the word-line electroconductive layers and the interlayer insulating films. The gate insulating film is formed along an inner wall of the through holes and includes a charge-accumulating film. The columnar semiconductor layer is formed inside the through holes to sandwich the gate insulating film along with the word-line electroconductive layer. The columnar semiconductor layer contains carbon, oxygen, or nitrogen.

14 Claims, 14 Drawing Sheets

(56) References Cited

U.S. PATENT DOCUMENTS

2009/0321813 A1* 12/2009 Kidoh et al. .................. 257/324
2010/0213538 A1* 8/2010 Fukuzumi et al. ............ 257/326
2010/0232224 A1* 9/2010 Maeda et al. ............ 365/185.18
2011/0175168 A1* 7/2011 Wang et al. .................. 257/369
2011/0227140 A1 9/2011 Ishiduki et al.
2011/0233646 A1 9/2011 Mizushima et al.
2012/0008400 A1 1/2012 Fukuzumi et al.
2012/0021577 A1* 1/2012 Purtell ......................... 438/270

OTHER PUBLICATIONS

Japanese Office Action dated Mar. 24, 2014, filed in Japanese counterpart Application No. 2012-092622, 13 pages (with translation).

* cited by examiner

United States Patent US 9,171,948 B2

NONVOLATILE SEMICONDUCTOR STORAGE DEVICE AND FABRICATION METHOD THEREOF

CROSS-REFERENCE TO RELATED APPLICATION

This application is based upon and claims the benefit of priority from Japanese Patent Application No. 2012-092622, filed Apr. 16, 2012, the entire contents of which are incorporated herein by reference.

FIELD

Embodiments described herein relate to a nonvolatile semiconductor storage device and the fabrication method thereof.

BACKGROUND

In recent years, many semiconductor storage devices (3-dimensional semiconductor storage devices) formed by arranging memory transistors (memory cells) in a 3-dimensional structure have been proposed to increase the degree of memory integration. For example, the conventional 3-dimensional semiconductor storage device has a columnar semiconductor layer extending in a direction perpendicular to a substrate and an electroconductive layer that surrounds the columnar semiconductor layer via a charge-accumulating layer. The columnar semiconductor layer functions as the body of the memory transistor. The electroconductive layer functions as a word line connected to the gate of the memory transistor and the memory transistor.

For the columnar semiconductor to better function as the body of the memory transistor, it is necessary to increase the mobility of the carrier in the columnar semiconductor layer. However, voids may be formed inside the columnar semiconductor layer when the columnar semiconductor layer is formed. When the voids move and make contact with the gate insulating film, the memory strings cannot function with the desired characteristics.

DETAILED DESCRIPTION

Embodiments provide a nonvolatile semiconductor storage device with increased carrier mobility that can maintain the mobility of a columnar semiconductor layer and minimize movement of voids which may be formed in the columnar semiconductor layer.

In general, a detailed description according to one embodiment of the nonvolatile semiconductor storage device disclosed in the present invention will be explained with reference to the figures.

The nonvolatile semiconductor storage device of the embodiment to be explained below has a plurality of memory strings in which electrically rewritable memory cells are connected in series. The memory strings have word-line electroconductive layers laminated at a prescribed interval to sandwich an interlayer insulating film onto a semiconductor substrate and through holes that penetrate through the word-line electroconductive layers and the interlayer insulating film perpendicularly with respect to the semiconductor substrate. The gate insulating film is formed along the inner wall of the through holes and includes a charge-accumulating film. The columnar semiconductor layer is formed inside the through holes to sandwich the gate insulating film along with the word-line electroconductive layer. The columnar semiconductor layer contains carbon, oxygen, or nitrogen.

(First Embodiment)
(Configuration of a Nonvolatile Semiconductor Storage Device 100 According to the First Embodiment)

Figure 1:
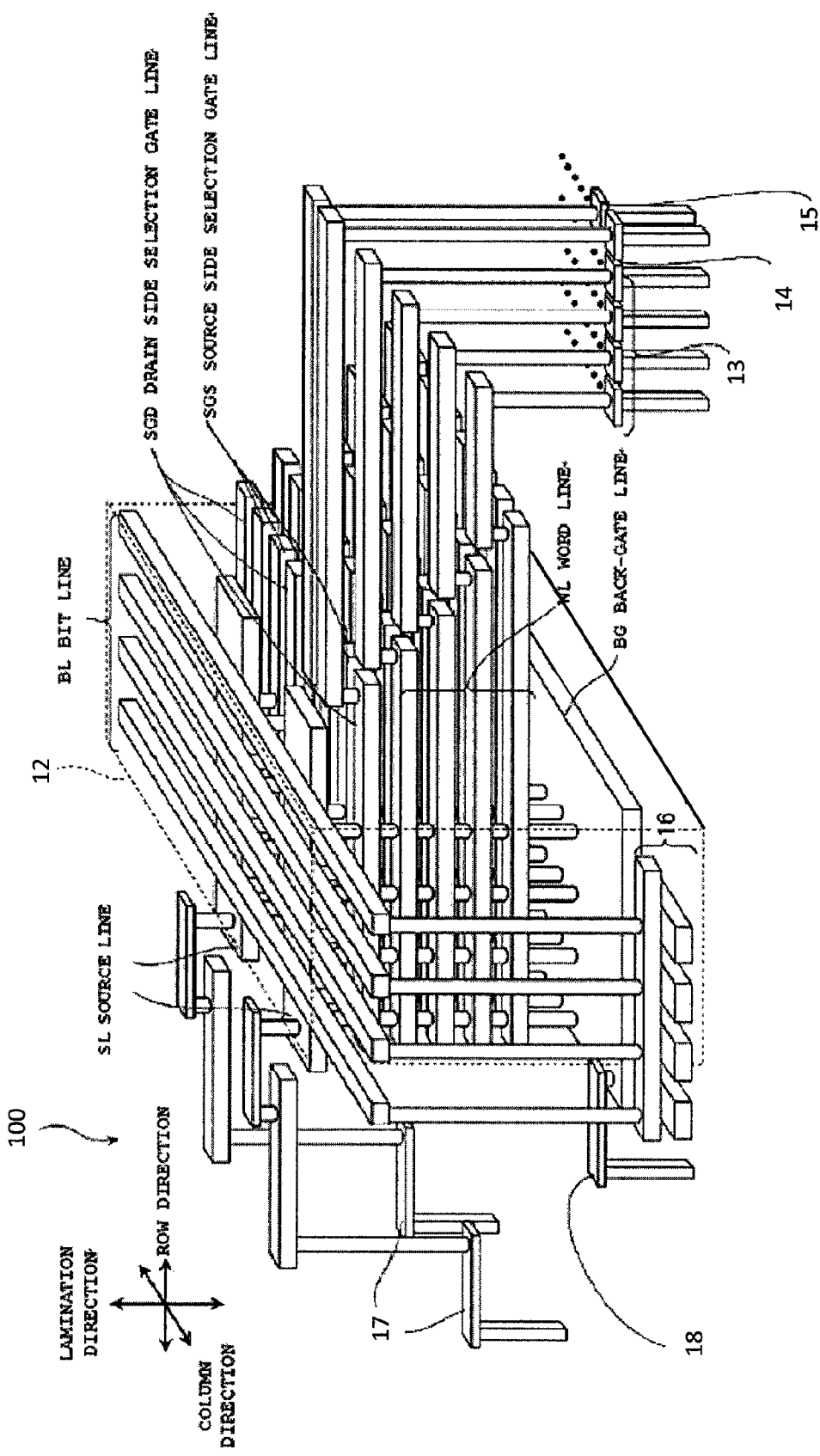
FIG. 1 is a schematic view of the nonvolatile semiconductor storage device according to a first embodiment.

FIG. 1 is a schematic view of the nonvolatile semiconductor storage device 100. As shown in FIG. 1, the nonvolatile semiconductor storage device 100 has a memory transistor region 12, a word line-driving circuit 13, a source side selection gate line-(SGS) driving circuit 14, a drain side selection gate line—(SGD) driving circuit 15, a sense amplifier 16, a source line-driving circuit 17, and a back gate transistor driving-circuit 18. The memory transistor region 12 has a memory transistor that stores the data.

The word line driving-circuit 13 controls the voltage applied to the word line WL. The source side selection gate line—(SGS) driving circuit 14 controls the voltage applied to the source side selection gate line SGS. The drain side selection gate line—(SGD) driving circuit 15 controls the voltage applied to the drain side selection gate line (SGD). The sense amplifier 16 amplifies the potential read from the memory transistor. The source line-driving circuit 17 controls the voltage applied to the source line SL. The back gate transistor-driving circuit 18 controls the voltage applied to the back gate line BG. In addition, the nonvolatile semiconductor storage device 100 has a bit line-driving circuit (not shown in the figure) that controls the voltage applied to the bit line BL.

Figure 2:
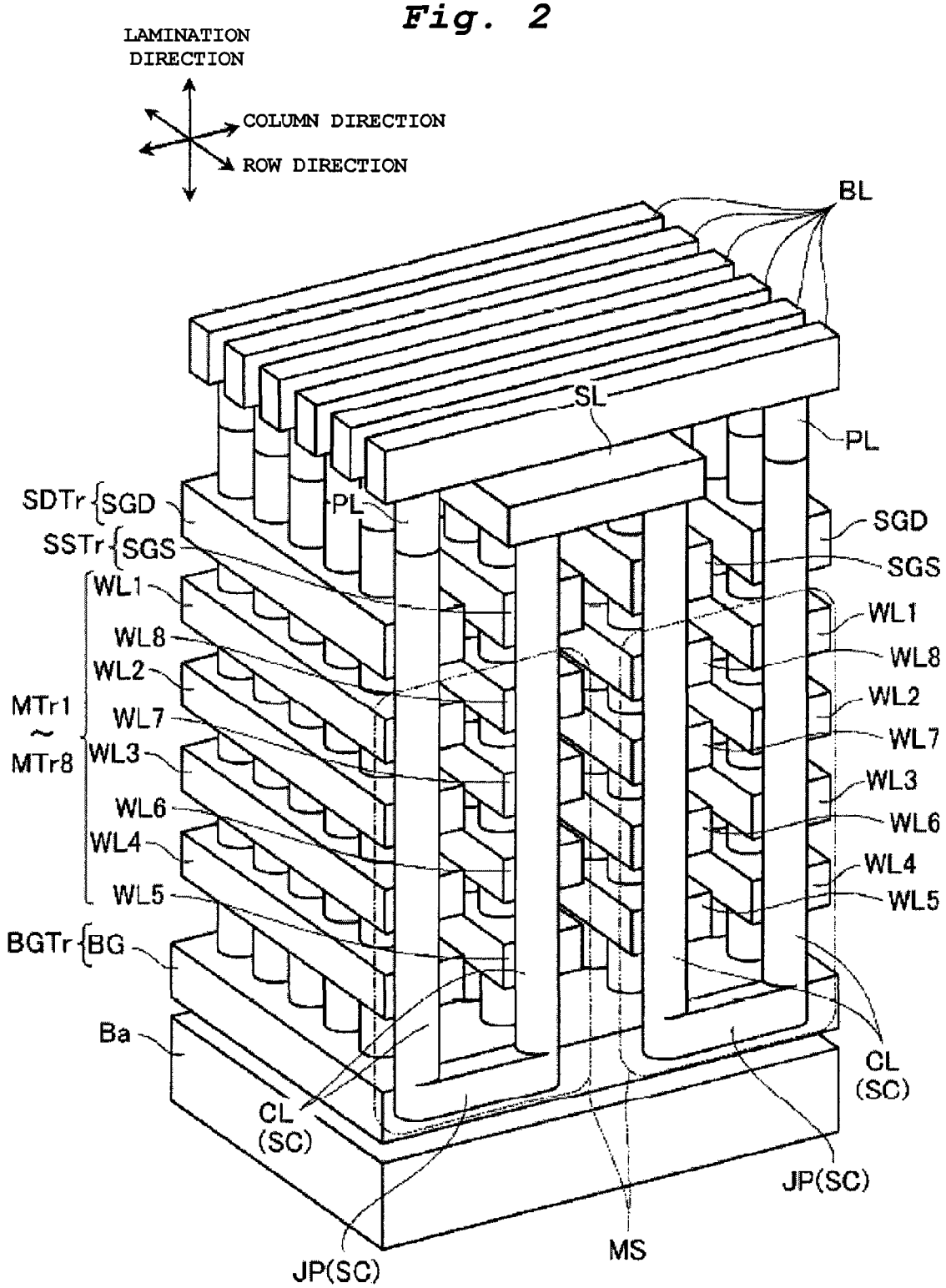
FIG. 2 is a schematic perspective view of a portion of the memory transistor region of the nonvolatile semiconductor storage device according to the first embodiment.

FIG. 2 is a partial schematic perspective view of the memory transistor region 12 of the nonvolatile semiconductor storage device 100 according to the first embodiment. In the first embodiment, the memory transistor region 12 is formed by arranging a memory string MS, a source side selection transistor SSTr, and a drain side selection transistor SDTr in a matrix pattern on a semiconductor substrate Ba.

For the volatile semiconductor device 100 according to the first embodiment, a large number of memory strings MS are provided in the memory transistor region 12. More specifically, as will be described later, the memory string MS is formed by connecting a large number of electrically rewritable memory transistors MTr in series.

Each memory string MS has a U-shaped semiconductor SC, a plurality of word lines WL1-WL8, and a back gate line BG.

The U-shaped semiconductor SC is formed in a U shape when viewed from the row direction. The U-shaped semiconductor SC has a pair of columnar structures CL extending almost perpendicular to a plane of a major surface of the semiconductor substrate Ba and a connecting portion JP utilized to connect the lower ends of the pair of columnar portions CL. The columnar portion CL can have a cylindrical or multi-faceted cross section. The columnar portion CL can also have a stepped columnar shape. In this case, the row direction is perpendicular to the lamination direction. The column direction, which will be described later, is perpendicular to the lamination direction and the row direction.

The U-shaped semiconductor SC is arranged such that the straight line connecting the central axes of the pair of columnar portions CL is parallel with the column direction. Also, the U-shaped semiconductor SC is arranged to provide a matrix pattern on the semiconductor substrate Ba.

The word lines WL1-WL8 of each layer are extended in parallel in the row direction. The word lines WL1-WL8 of each layer are insulated and separated from each other by an interlayer insulating film that is not shown in FIG. 2, and they are formed repeatedly in a line shape at a prescribed angle in the column direction. The word line WL1 is formed in the same layer as the word line WL8 in the column direction. Similarly, the word line WL2 is formed in the same layer as the word line WL7. The word line WL3 is formed in the same layer as the word line WL6. The word line WL4 is formed in the same layer as the word line WL5.

The gates of the memory transistors MTr1-MTr8 are provided side-by side in the row direction and at the same position in the column direction are connected to the same word lines WL1-WL8. Also, as shown in FIG. 1, the end parts of each word line WL1-WL8 in the row direction are formed in a stepwise manner. Each word line WL1-WL8 is formed to surround a portion of the columnar portions CL in the row direction.

Figure 3:
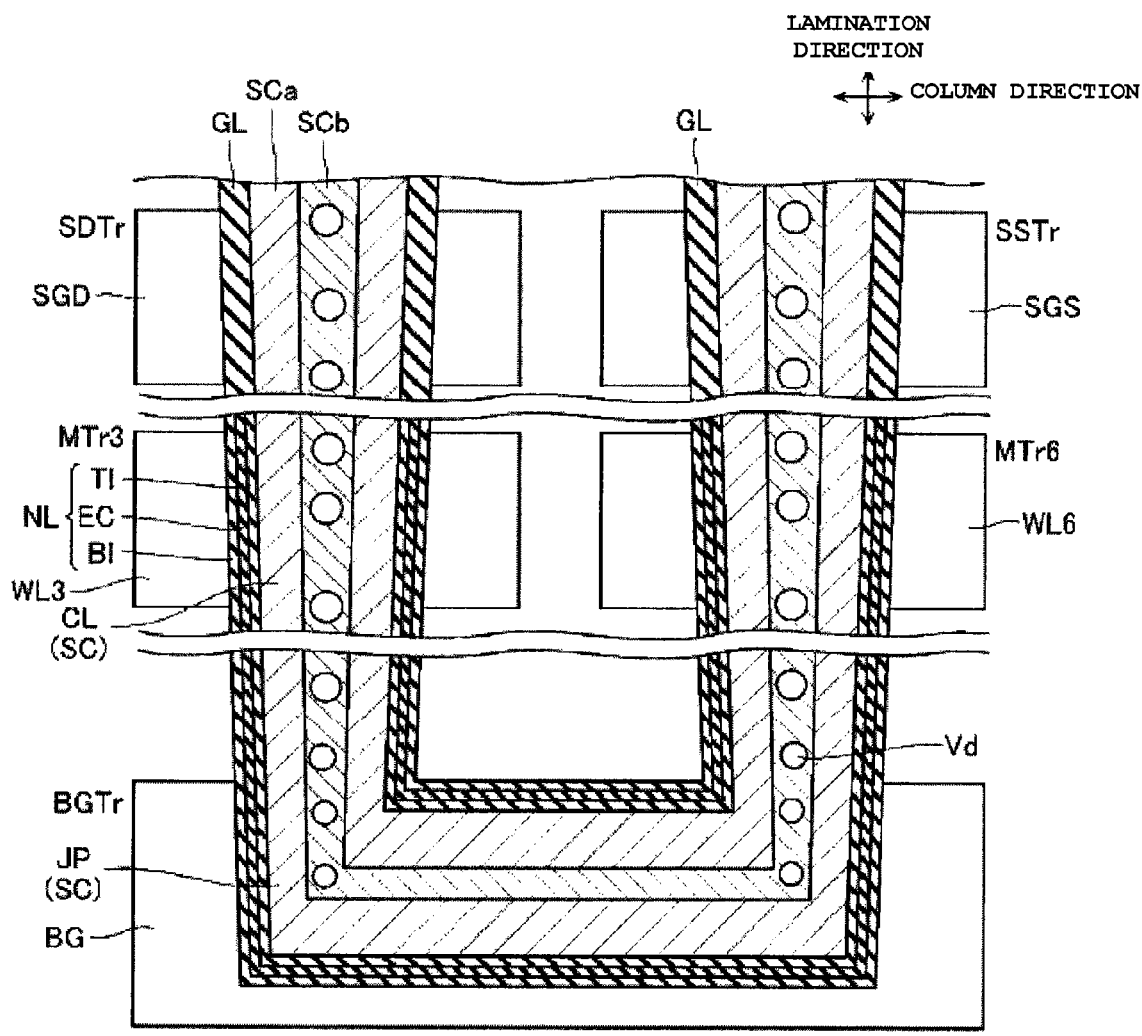
FIG. 3 is an enlarged view of a portion of the memory string of FIG. 2.

FIG. 3 is an enlarged view of a portion of the memory string MS of FIG. 2 and shows the drain side-selection transistor SDTr, the source side-selection transistor SSTr, the one-layer word lines WL3 and WL6, and memory transistors MTr3 and MTr6. Memory transistors MTr1-2, 4-5, and 7-8 also have the same structure, although they are omitted from FIG. 3.

As shown in FIG. 3, an ONO (oxide-nitride-oxide) layer NL is formed between the word lines WL1-WL8 and the columnar portion CL. The ONO film NL functions as the gate insulting film and charge-accumulation film of the memory cell. The ONO film NL has a tunnel insulating layer TI in contact with the columnar portion CL, a charge-accumulating layer EC in contact with the tunnel insulating layer TI, and a block insulting layer BI in contact with the charge-accumulating layer EC. The charge-accumulating layer EC has the function of accumulating charges. For the configuration, in other words, the charge-accumulating layer EC is provided to surround the side surface of the columnar portion CL. Each of the word lines WL1-WL8 is formed to surround the charge-accumulating layer EC.

Also, as shown in FIG. 3, the gate insulating film GL is formed between the drain side selection gate line SGD and the U-shaped semiconductor SC. Similarly, the gate insulating film GL is formed between the source side selection gate line SGS and the U-shaped semiconductor SC.

The back gate line BG is formed as an expanded plate shape in the row direction and the column direction to cover the bottom parts of the connecting portions JP of the large number of the U-shaped semiconductors SC arranged in the matrix pattern on the semiconductor substrate Ba. As shown in FIG. 3, the ONO film NL is formed between the back gate line BG and the connecting portion JP.

The back gate transistor BGTr includes the connecting portion JP, the ONO film NL (the charge-accumulating layer EC), and the back gate line BG. The end part of the back gate transistor BGTr that is in contact with the ONO film NL of the back plate line BG functions as the control gate electrode of the back gate transistor BGTr.

Returning to FIG. 2, the two U-shaped semiconductors SC adjacent to each other in the column direction are commonly connected to the one source line SL. The length of the source line SL is formed to extend in the row direction.

The bit line BL is formed on the plug line PL at one end of the U-shaped semiconductor SC. The bit line BL is positioned higher than source line SL. Each bit line BL is formed at a prescribed interval in the row direction and in a linear shape that extends in the column direction.

Also, as shown in FIG. 3, the U-shaped semiconductor SC has a first semiconductor layer SCa that is formed in contact with the ONO film NL and has a void inside (near the center of the cross section along the columnar portion CL), and a second semiconductor layer SCb is formed to fill this void. The first semiconductor layer SCa is usually made of polysilicon, while the second semiconductor layer SCb is made of polysilicon doped with carbon (C), oxygen (O), or nitrogen (N). The second semiconductor layer SCb is formed to fill the gap in the first semiconductor layer SCa, it has voids Vd inside as shown in FIG. 3. Because the U-shaped semiconductor SC of this embodiment includes the first semiconductor layer SCa and the second semiconductor layer SCb, it is possible to increase the carrier mobility and restrain the movement of the voids Vd. The reason this is possible will be described later.

Figure 4:
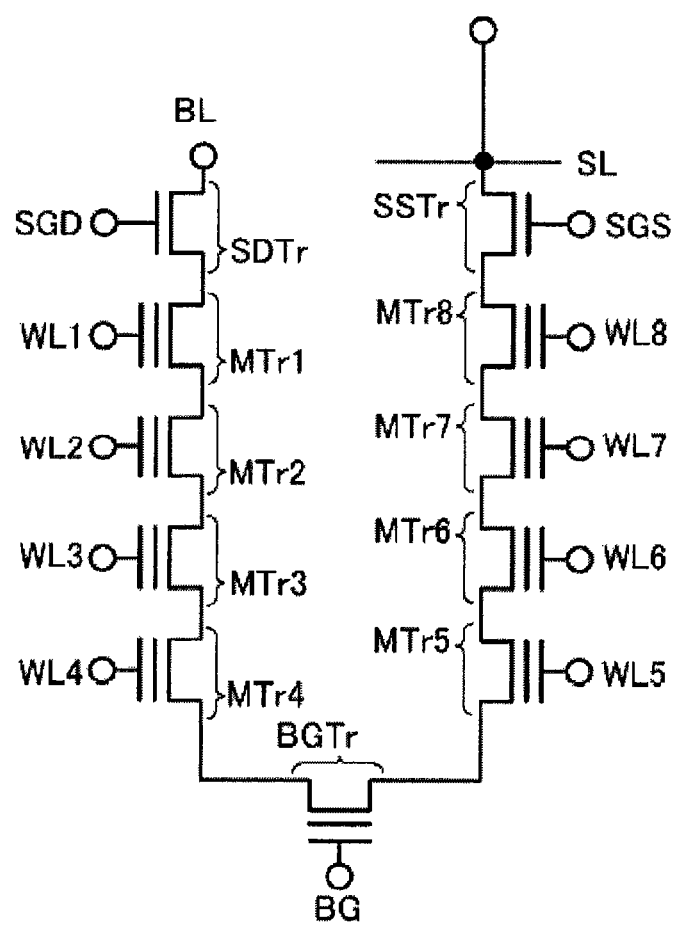
FIG. 4 is a circuit diagram explaining the circuit including the memory string, the drain side selection transistor, and the source side selection transistor in the first embodiment.

In the following, the circuit configuration including the memory string MS, the drain side selection transistor SDTr, and the source side selection transistor SSTr according to the first embodiment will be explained with reference to FIG. 4. FIG. 4 is a circuit diagram of the memory string MS, the drain side selection transistor SDTr, and the source side selection transistor SSTr in the first embodiment, as described in FIGS. 2 and 3.

As shown in FIG. 4, in the first embodiment, each memory string MS is formed by connecting the eight electrically rewritable memory transistors MTr1-MTr8 in series. The source side selection transistor SSTr and the drain side selection transistor SDTr are connected to the opposing ends of the memory string MS. The back gate transistor BGTr is provided between the memory transistors MTr4 and MTr5 in the memory string MS.

Each of the memory transistors MTr1-MTr8 includes a portion of: The columnar portion CL, the ONO film NL (the charge-accumulating layer EC), and of the crossing word lines WL1-WL8, as shown in FIG. 2. The part of the word lines WL1-8 in contact with the ONO film NL functions as the control gate electrode of the memory transistors MTr1-MTr8.

Figure 5:
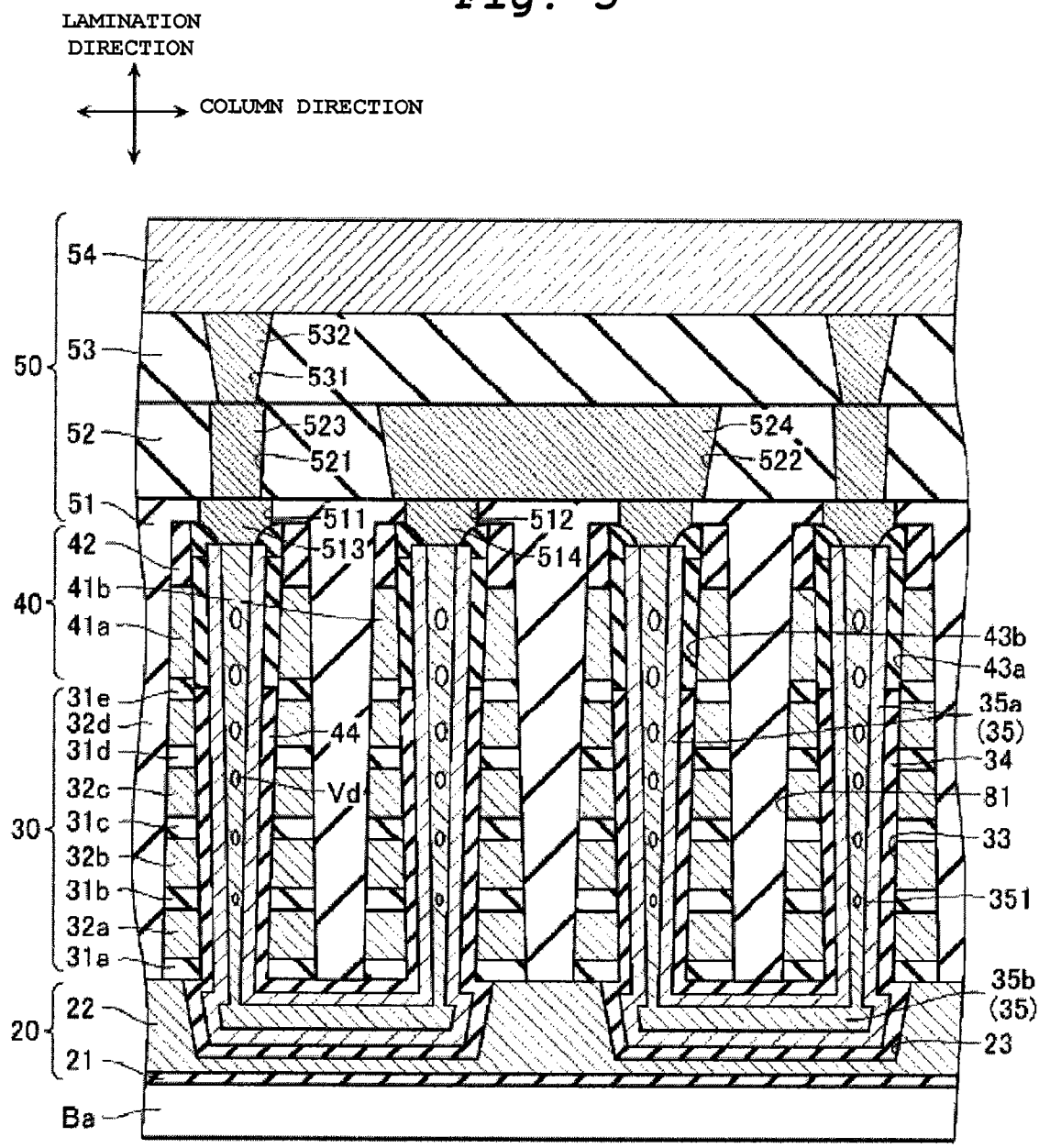
FIG. 5 explains the configuration of the nonvolatile semiconductor device according to the first embodiment in more detail.

In the following, the configuration of the nonvolatile semiconductor device 100 according to the first embodiment will be explained in more detail with reference to FIG. 5. FIG. 5 is a cross-sectional view of the memory transistor region 12 of the nonvolatile semiconductor device 100 according to the first embodiment.

As shown in FIG. 5, the memory transistor region 12 has a back gate transistor layer 20, a memory transistor layer 30, a selection transistor layer 40, and a wiring layer 50, formed sequentially, in the lamination direction, from the semiconductor substrate Ba. The back gate transistor layer 20 functions as the back gate transistor BGTr. The memory transistor layer 30 functions as the memory transistors MTr1-MTr8. The selection transistor layer 40 functions as the source side selection transistor layer SSTr and the drain side selection transistor SDTr.

The back gate transistor layer 20 has a back gate insulating-layer 21 and a back gate electroconductive layer 22 layered sequentially onto the semiconductor substrate Ba. The back gate electroconductive layer 22 is equivalent to the back gate line BG shown in FIG. 2. The back gate insulating layer 21 and the back gate electroconductive layer 22 are formed in a plate shape that extends in the column direction and the row direction (into or out of the paper as shown in FIG. 5). The back gate insulating layer 21 and the back gate electroconductive layer 22 are divided for each block as a minimum unit of the erasure portion.

The back gate electroconductive layer 22 covers the bottom surface and side surface of the connection part (connecting portion JP) of a U-shaped semiconductor layer 35, which will be described later, and is formed to the same height as the top surface of the connecting portion.

The back gate insulating layer 21 is made of silicon dioxide ($SiO_2$). The back gate electroconductive layer 22 is made of polysilicon (p-Si).

Also, the back gate transistor layer 20 has a back gate hole 23 formed to extend into the back gate electroconductive layer 22. The back gate hole 23 includes an opening that has a length direction extending in the column direction. The back gate hole 23 is formed in a matrix pattern in the row direction and column direction in a plane parallel to the semiconductor substrate Ba.

The memory transistor layer 30 has first-fifth inter-word line insulating layers 31a-31e, layered onto the back gate electroconductive layer 22, and the first-fifth inter-word line insulating layers 31a-31e alternate with the first-fourth word-line electroconductive layers 32a-32d. The first-fourth word-line electroconductive layers 32a-32d constitute the word lines WL1-8 shown in FIG. 2.

The first-fifth inter-word line insulating layers 31a-31e and the first-fourth word-line electroconductive layers 32a-32d are formed in a linear shape to extend in the row direction and are formed repeatedly at a prescribed interval in the column direction.

The first-fifth inter-word line insulating layers 31a-31e are made of silicon dioxide ($SiO_2$). The first-fourth word-line electroconductive layers 32a-32d are made of polysilicon (p-Si).

The memory transistor layer 30 has memory holes 33 (through holes) formed to penetrate through the first-fifth inter-word line insulating layers 31a-31e and the first-fourth word-line electroconductive layers 32a-32d, as well as a groove 81. The memory holes 33 are formed near the two ends of each back gate hole 23 (in the column direction).

The groove 81 is formed to divide the word-line electroconductive layers 32a-32b for each columnar portion CL (shown in FIG. 2). The groove 81 is formed to extend in the row direction. Also, the back gate transistor layer 20 and the memory transistor layer 30 have a memory gate insulating layer 34 and a U-shaped semiconductor layer 35. The memory gate insulating layer 34 is formed along the inner wall of the memory hole 33 and the inner wall of the back gate hole 23. The memory gate insulating layer 34 is equivalent to the ONO film NL shown in FIG. 3. Although it is omitted from the figure, the memory gate insulating layer includes an ONO film of silicon dioxide ($SiO_2$), silicon nitride (the charge-accumulating layer) (SiN), and silicon dioxide ($SiO_2$).

The U-shaped semiconductor layer 35 is formed in a U shape when viewed from the row direction. The U-shaped semiconductor layer 35 is formed in contact with the memory gate insulating layer 34 to bury the back gate hole 23 and the memory hole 33. The U-shaped semiconductor layer 35 is equivalent to the U-shaped semiconductor SC shown in FIG. 2. The U-shaped semiconductor layer 35 has a pair of columnar portions extended perpendicular to the semiconductor substrate Ba and a connecting part formed to connect the lower ends of the pair of columnar portions.

Also, the U-shaped semiconductor layer 35 includes a first semiconductor layer 35a and a second semiconductor layer 35b. The first semiconductor layer 35a is formed along the inner wall of the back gate hole 23 and the memory hole 33 via the memory gate insulating film 34. However, the first semiconductor layer 35a is not formed to completely fill the back gate hole 23 and the memory hole 33, but merely lines the hole. Thus, the first semiconductor layer 35a leaves a trench 351 near the center of the back gate hole 23 structure and the memory hole 33 (near the center of the cross section of the memory hole 33 structure and across the layer in a direction parallel to the semiconductor substrate Ba).

The second semiconductor layer 35b is formed to fill the trench 351. Although not desired, one or more voids Vd may form in the second semiconductor layer 35b when the second semiconductor layer 35b is formed to fill the narrow trench 351.

The first semiconductor layer 35a is formed by depositing amorphous silicon inside the back gate hole 23 and the memory hole 33 by means of a vacuum CVD method or similar. After the vacuum CVD process, a heat treatment process is carried out to crystallize the amorphous silicon and to convert it into polysilicon. It is also possible to use polycrystalline silicon germanium instead of polysilicon as the material for the first semiconductor layer 35a.

The second semiconductor layer 35b is also formed in the same manner as the first semiconductor layer 35a. However, the second semiconductor layer 35b is deposited with a carbon (C) dopant in a prescribed proportion in the amorphous silicon being deposited to form the second semiconductor layer 35b. It is also possible to dope the film with oxygen (O) or nitrogen (N) instead of carbon (C). In the following section, the example of carbon (C) doping will be explained. However, the fabrication method is basically the same for the other elements, and the effect on the final structure is also the same. The concentration of carbon (C) in the second semiconductor layer 25b is about 1%. The carbon concentration, however, is not limited to 1%. The appropriate carbon concentration can be set depending on the required degree of restraint desired for minimizing movement of the voids Vd. The concentration of carbon (C) can be determined, for example, using an atom probe.

The second semiconductor layer 35b has a higher concentration of carbon (C) (or oxygen [O] or nitrogen [N]) than the first semiconductor layer 35a. The voids Vd may be formed as described on the surface, or within, the second semiconductor layer 35b, but the movement of the voids Vd is restrained by carbon (C) in the film layer 35b. If the voids Vd migrate and contact the memory gate insulating film 34, the characteristics of the memory transistor MTr may deteriorate as the surface area of contact between the electrode and polysilicon is reduced, thus reducing the area over which the electric pathway there between is formed. By restraining the movement of the voids Vd, the operation of the memory transistor MTr can be maintained with the desired characteristics.

The selection transistor layer 40 has a drain side electroconductive layer 41a, a source side electroconductive layer 41b, and a selection transistor insulating layer 42 deposited onto a memory transistor layer 30. The drain side electroconductive layer 41a and the source side electroconductive layer 41b are equivalent to the drain side selection gate line SGD and the source side selection gate line SGS (FIGS. 1-4). The drain side electroconductive layer 41a and the source side electroconductive layer 41b are formed in a linear shape (stripe shape) to extend in the row direction and are formed repeatedly at a prescribed interval in the column direction. The selection transistor insulating layer 42 is formed on the top of the drain side electroconductive layer 41a and the source side electroconductive layer 41b.

The drain side electroconductive layer 41a is provided at a prescribed angle in the column direction (tapering in the lamination direction) and is formed to extend in the row direction. Similarly, the source side electroconductive layer 41b is provided at a prescribed angle in the column direction (tapering in the lamination direction) and is formed to extend in the row direction. A pair of drain side electroconductive layers 41a and a pair of source side electroconductive layers 41b are formed alternately in the column direction. The drain side electroconductive layer 41a and the source side electroconductive layer 41b are made of polysilicon (p-Si) (P+semiconductor) implanted with boron (B).

Also, the selection transistor layer 40 has the drain side hole 43a and the source side hole 43b. The drain side hole 43a is formed to penetrate through the selection transistor insulating layer 42 and the drain side electroconductive layer 41a. The source side hole 43b is formed to penetrate through the selection transistor insulating layer 42 and the source side electroconductive layer 41b. The lower ends of the drain side hole 43a and the source side hole 43b are formed to match the upper end of the memory hole 33.

A gate insulating film 44 of the drain side selection transistor SDTr and the source side selection transistor SSTr is formed along the inner wall of the drain side hole 43a and the source side hole 43b. The U-shaped semiconductor layer 35 covers the inside the drain side hole 43a and the source side hole 43b to sandwich the gate insulating film 44 along with the drain side electroconductive layer 41a or the source side electroconductive layer 41b.

The wiring layer 50 has a first interlayer insulating layer 51, a second interlayer insulating layer 52, a third interlayer insulating layer 53, and a bit line electroconductive layer 54 that are sequentially laminated onto the selection transistor insulating layer 42.

The first interlayer insulating layer 51 fills the groove 81 and is formed on the top of the selection transistor insulating layer 42. The first interlayer insulating layer 51 has a first hole 511 and a second hole 512. The first hole 511 and the second hole 512 are formed to penetrate through the first interlayer insulating layer 51.

The first hole 511 is formed at a position corresponding to the drain side hole 43a. The second hole 512 is formed at a position corresponding to the source side hole 43b. The first interlayer insulating layer 51 has the first and second plug layers 513 and 514 formed to cover the first hole 511 and the second hole 512. The first plug layer 513 and the second plug layer 514 are in electrical contact with the upper end of the U-shaped semiconductor layer 35.

The second interlayer insulating layer 52 is formed on the first interlayer insulating layer 51. The second interlayer insulating layer 52 has a third hole 521 and a groove 522. The third hole 521 and the groove 522 are formed to penetrate through the second interlayer insulating layer 52. The third hole 521 is formed at a position corresponding to the first hole 511. The groove 522 is formed such that a pair of second holes 512 adjacent to each other in the column direction is positioned on the bottom surface of the groove 522. The groove 522 is formed to extend in the row direction.

The second interlayer insulating layer 52 has a third plug layer 523 formed to cover the third hole 521. The second interlayer insulating layer 52 has a source-line electroconductive layer 524 formed to bury the groove 522. The source-line electroconductive layer 524 is equivalent to the source line in FIG. 2.

The third interlayer insulating layer 53 is formed on the second interlayer insulating layer 52. The third interlayer insulating layer 53 has a fourth hole 531. The fourth hole 531 is formed to penetrate through the third interlayer insulating layer 53. The fourth hole 531 is formed at a position corresponding to the third hole 521. The third interlayer insulating layer 53 has a fourth plug layer 532 formed to cover the fourth hole 531.

The bit-line electroconductive layer 54 is formed repeatedly at a prescribed angle in the row direction and is formed having a length that extends along the column direction. The bit-line electroconductive layer 54 functions as a bit line BL.

The first through the third wiring insulating layers 51-53 are made of silicon dioxide ($SiO_2$). The first-fourth plug layers 513, 514, 523, 542, the source-line electroconductive layer 524, and the bit-line electroconductive layer 54 are made of titanium (Ti), titanium nitride (TiN), and tungsten (W).

(Method for Fabricating the Nonvolatile Semiconductor Storage Device 100 According to the First Embodiment)

In the following section, the method for fabricating the nonvolatile semiconductor storage device 100 according to the first embodiment will be explained with reference to FIG. 6 through FIG. 14. FIG. 6 through FIG. 14 are cross-sectional views illustrating the process of fabricating the nonvolatile semiconductor storage device 100 (FIG. 1) according to the first embodiment.

Figure 6:
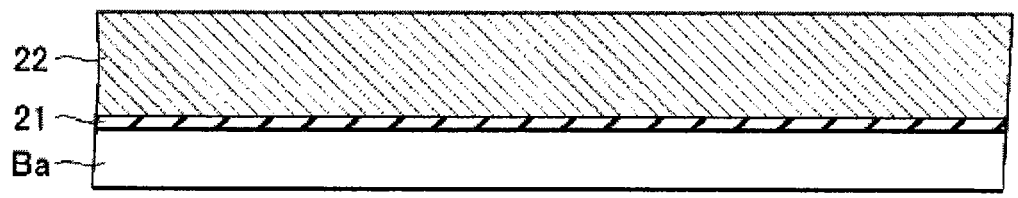
FIG. 6 is a process diagram illustrating the fabrication method of the nonvolatile semiconductor storage device according to the first embodiment.

First, as shown in FIG. 6, silicon dioxide ($SiO_2$) and P-type polysilicon (or single-crystal p-type silicon) are deposited on the semiconductor substrate Ba to form the back gate insulating layer 21 and the back gate electroconductive layer 22.

Figure 7:
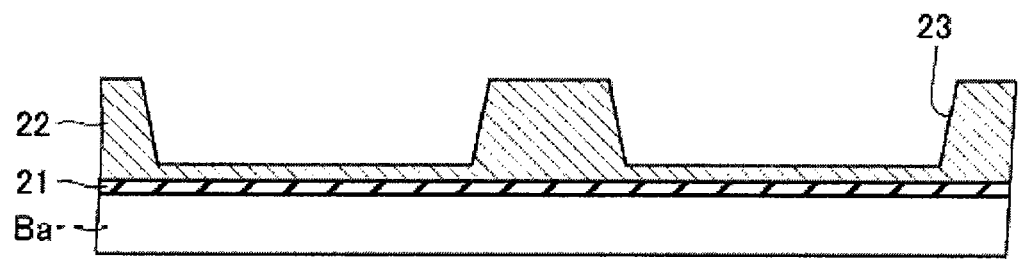
FIG. 7 is a process diagram illustrating the fabrication method of the nonvolatile semiconductor storage device according to the first embodiment.

Then, as shown in FIG. 7, a lithographic method or RIE (reactive ion etching) method is used to form trenches in the back gate electrode layer 22 to form the back gate hole 23.

Figure 8:
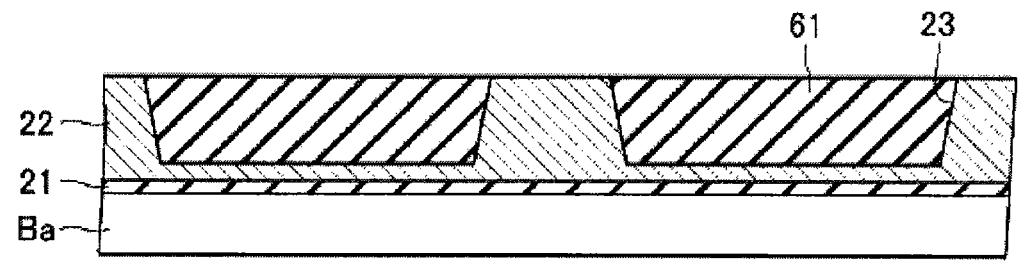
FIG. 8 is a process diagram illustrating the fabrication method of the nonvolatile semiconductor storage device according to the first embodiment.

Subsequently, as shown in FIG. 8, silicon nitride (SiN) is deposited to bury the back gate hole 23 to form a sacrificial layer 61.

Figure 9:
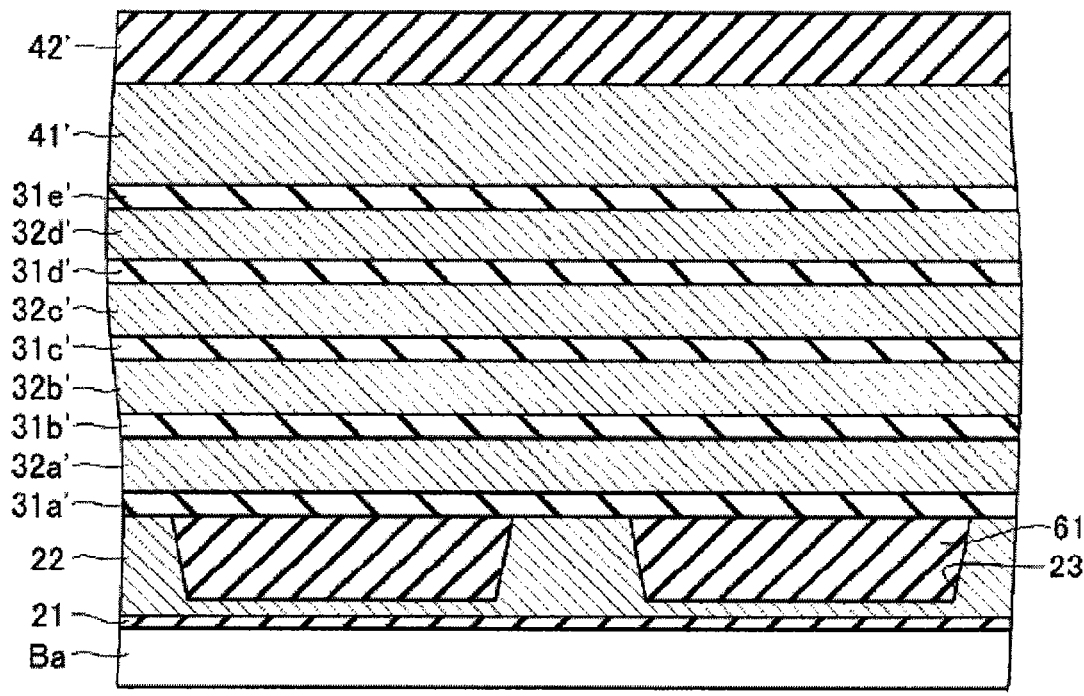
FIG. 9 is a process diagram illustrating the fabrication method of the nonvolatile semiconductor storage device 100 according to the first embodiment.

Then, as shown in FIG. 9, silicon dioxide ($SiO_2$) and polysilicon (p-Si) are deposited alternately onto the back gate electroconductive layer 22 and the sacrifice layer 61 to form the first-fifth insulating layers 31a'-31e' and the first-fourth electroconductive layers 32a'-32d'. Then, silicon dioxide ($SiO_2$) and polysilicon (p-Si) are layered on the top of the fifth insulating layer 31e' to form the electroconductive layer 41' and the insulating layer 42'. In this case, the first-fifth insulating layers 31a'-31e' become the first-fifth inter-word line insulating layers 31a-31e (FIG. 5) as a result of a step that will be described later. The first-fourth electroconductive layers 32a'-32d' become the first-fourth word-line electroconductive layers 32a-32d (FIG. 5). Also, the electroconductive layer 41' becomes the drain side electroconductive layer 41a and the source side electroconductive layer 41b (FIG. 5). The insulating layer 42' becomes the selection transistor insulating layer 42 (FIG. 5).

Figure 10:
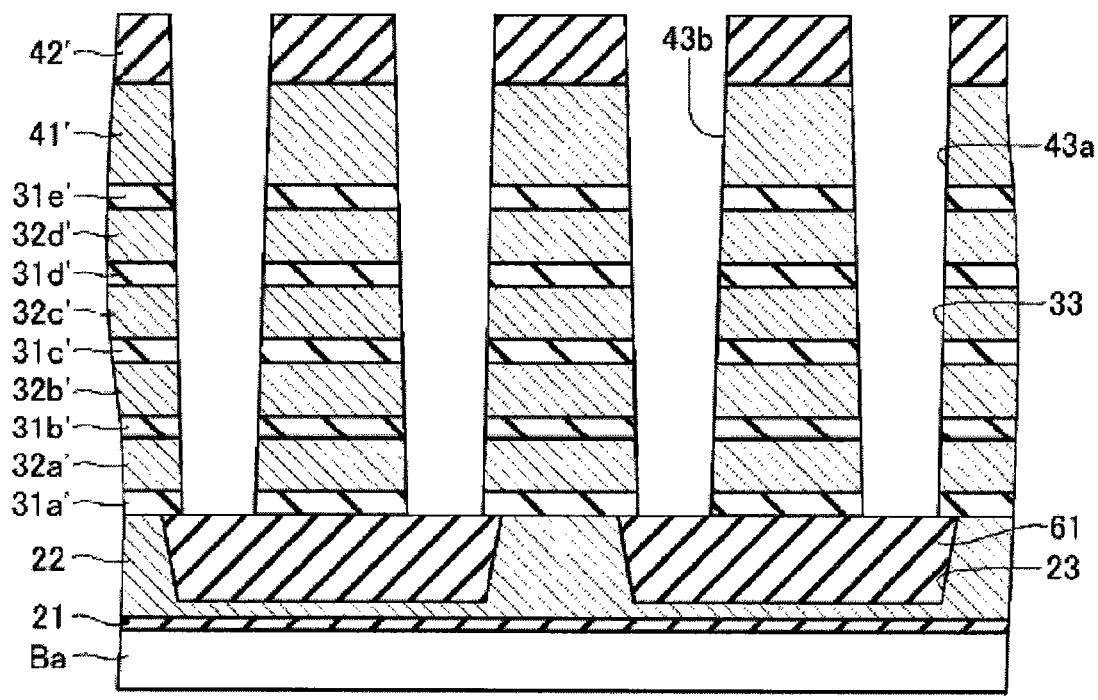
FIG. 10 is a process diagram illustrating the fabrication method of the nonvolatile semiconductor storage device 100 according to the first embodiment.

Then, as shown in FIG. 10, the memory hole 33 is formed to penetrate through the insulating layer 42', the electroconductive layer 41', the first-fifth insulating layers 31a'-31e', and the first-fourth electroconductive layers 32a'-32d'. The memory hole 33 is formed to reach the top surface at the two ends of the sacrificial layer 61 in the column direction.

Figure 11:
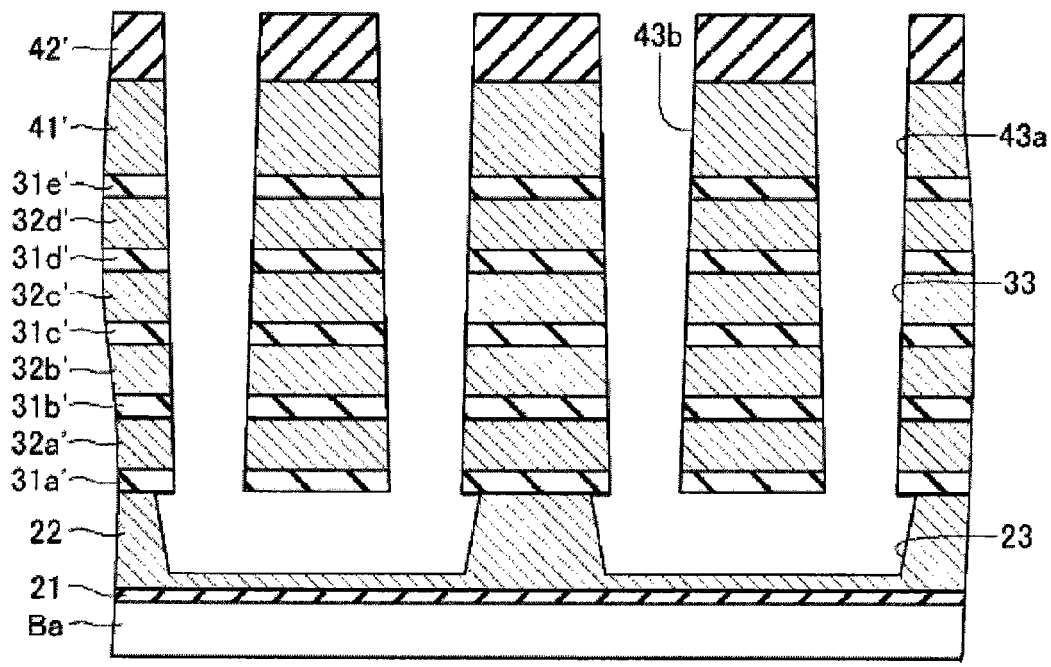
FIG. 11 is a process diagram illustrating the fabrication method of the nonvolatile semiconductor storage device 100 according to the first embodiment.
Figure 12:
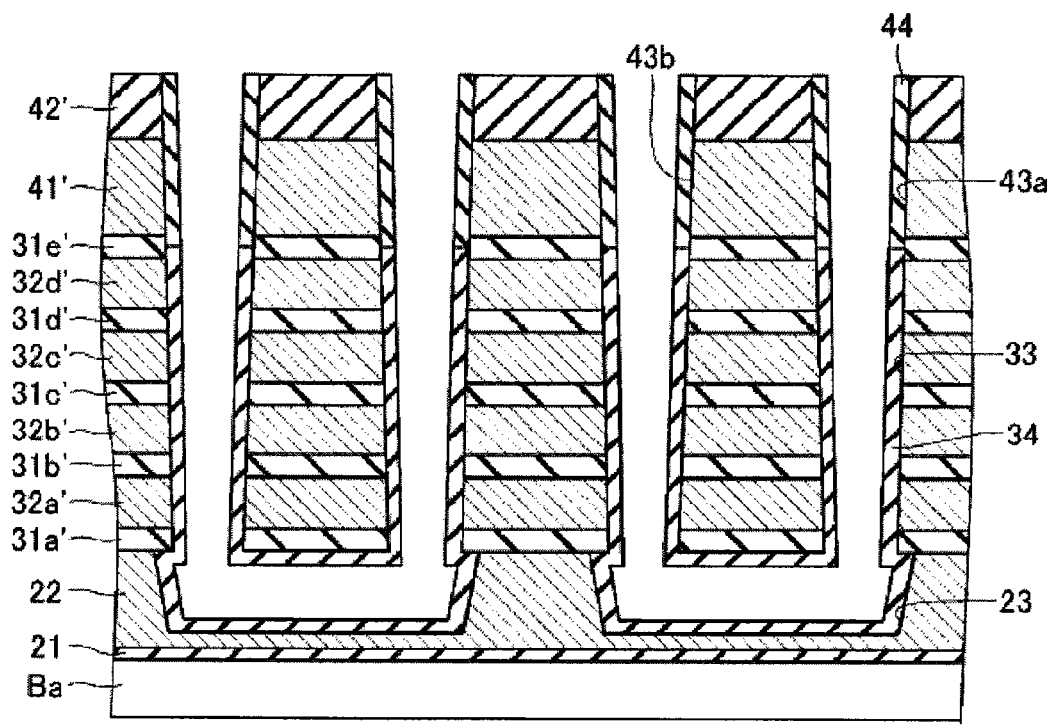
FIG. 12 is a process diagram illustrating the fabrication method of the nonvolatile semiconductor storage device 100 according to the first embodiment.

Then, as shown in FIG. 11, the sacrificial layer 61 is removed using a hot phosphoric acid solution. Then, as shown in FIG. 12, silicon dioxide ($SiO_2$), silicon nitride (SiN), and silicon dioxide ($SiO_2$) are laminated sequentially onto the sidewall facing the drain side hole 43a, the source side hole 43b, the memory hole 33, and the back gate hole 23 to form the memory gate insulating layer 34.

Figure 13:
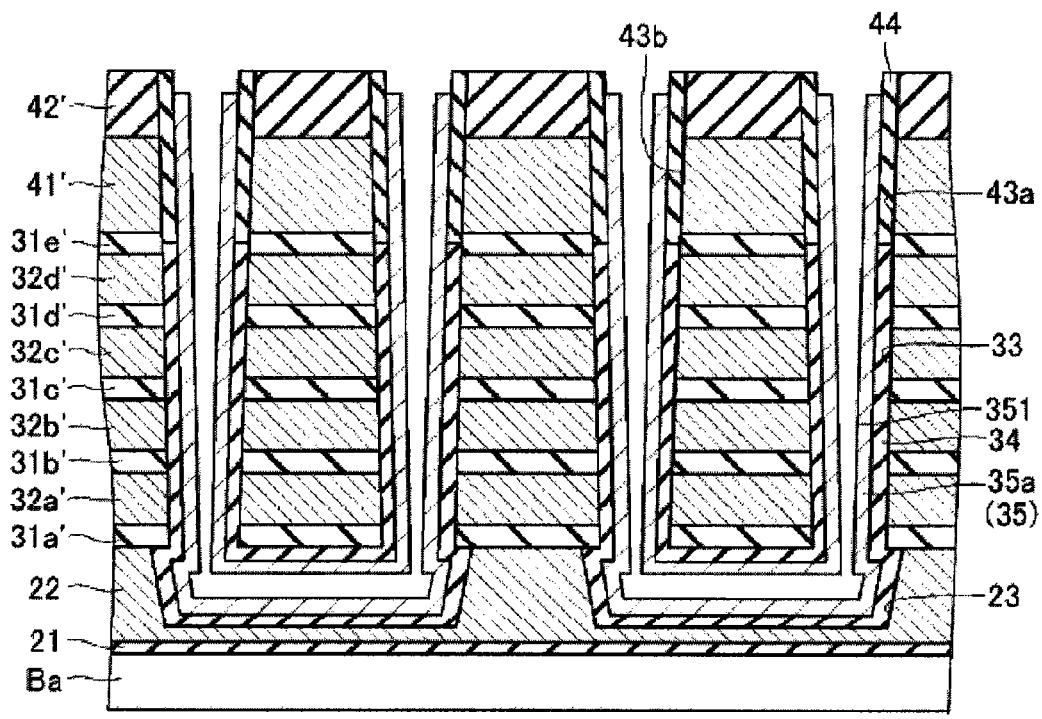
FIG. 13 is a process diagram illustrating the fabrication method of the nonvolatile semiconductor storage device 100 according to the first embodiment.

Then, as shown in FIG. 13, the CVD method or similar is used to deposit amorphous silicon in contact with the memory gate insulating layer 34 leaving an opening 351 in the drain side hole 43a layer, the source side-hole 43b layer, the memory hole 33 layer, and the back gate hole 23 layer. At this stage, monosilane gas is used as the process gas to carry out the CVD method. In this way, the first semiconductor layer 35a is formed.

Figure 14:
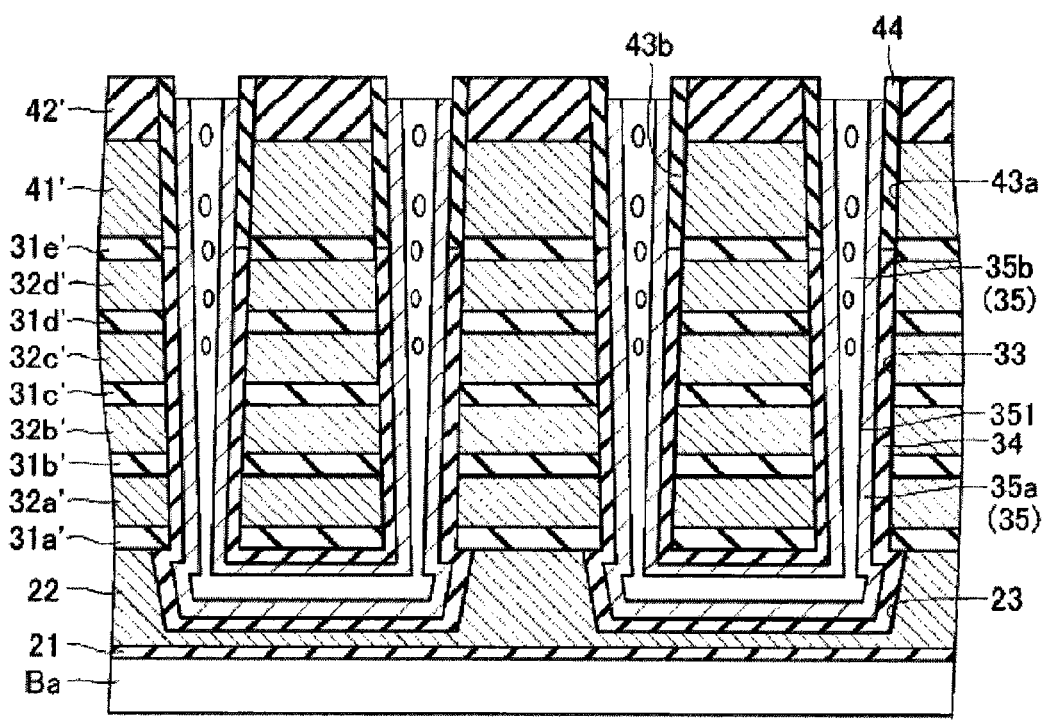
FIG. 14 is a process diagram illustrating the fabrication method of the nonvolatile semiconductor storage device 100 according to the first embodiment.

Then, as shown in FIG. 14, the CVD method is used to deposit amorphous silicon to fill the trench 351. In this way, the second semiconductor layer 35b is formed. Monomethyl silane gas may be used as the process gas in the CVD method for depositing the second semiconductor layer 35b. It is also possible to use a gas mixture of monomethyl silane gas and monosilane gas to increase the proportion of the monomethyl silane gas as the deposition is carried out. Because the monomethyl silane contains C, amorphous silicon containing carbon (C) is deposited. After that, a prescribed heat treatment is carried out to convert the amorphous silicon of the first semiconductor layer 35a and the second semiconductor layer 35b into polysilicon.

After that, the structure shown in FIG. 5 is formed using the conventional method.

(Effect of the Nonvolatile Semiconductor Storage Device 100 According to the First Embodiment)

In the following, the effect of the nonvolatile semiconductor storage device 100 according to the first embodiment will be explained. In this embodiment, the U-shaped semiconductor layer 35 has the first semiconductor layer 35a in contact with the memory gate insulating film 34 (the ONO film) and the second semiconductor layer 35b provided in the trench 351 therein. The concentration of carbon (C), oxygen (O), or nitrogen (N) in the second semiconductor layer 35b is higher than the concentration of carbon (C), oxygen (O), or nitrogen (N) in the first semiconductor layer 35a.

When carbon (C) or similar is present in the U-shaped semiconductor layer 35 the carrier mobility drops. However, in contrast, the void Vd formed does not easily migrate. In this embodiment, where the current flows out sufficiently only near the memory gate insulating film 34 (that is, on the surface of the U-shaped semiconductor layer 34 during conduction of the columnar memory string MS), then the device can effectively operate as an NAND-type flash memory despite the voids and the presence of C in the second semiconductor layer 35b. Consequently, in this embodiment, the concentration of carbon (C) or similar dopant of the first semiconductor layer 35a in contact with the back gate hole 23 and the memory hole 33 via the memory gate insulating film 34 is reduced to guarantee the essential carrier mobility. In contrast, the second semiconductor layer 35b formed in the trench 351 has a high concentration of carbon (C) or similar to restrain the movement of the void Vd. In other words, according to this embodiment, it is possible to maintain high carrier mobility with film 35a and effectively restrain the movement of the voids formed in the center of the feature by using a second, carbon doped, film there. In the embodiment, amorphous silicon is first deposited as the material of the U-shaped semiconductor SC (the U-shaped semiconductor layer 35) followed by a heat treatment to convert the amorphous silicon into polysilicon. The present invention, however, is not limited to this description. For example, it is also possible to form the U-shaped semiconductor layer 35 by depositing polysilicon from the beginning.

(Second Embodiment)

Figure 15:
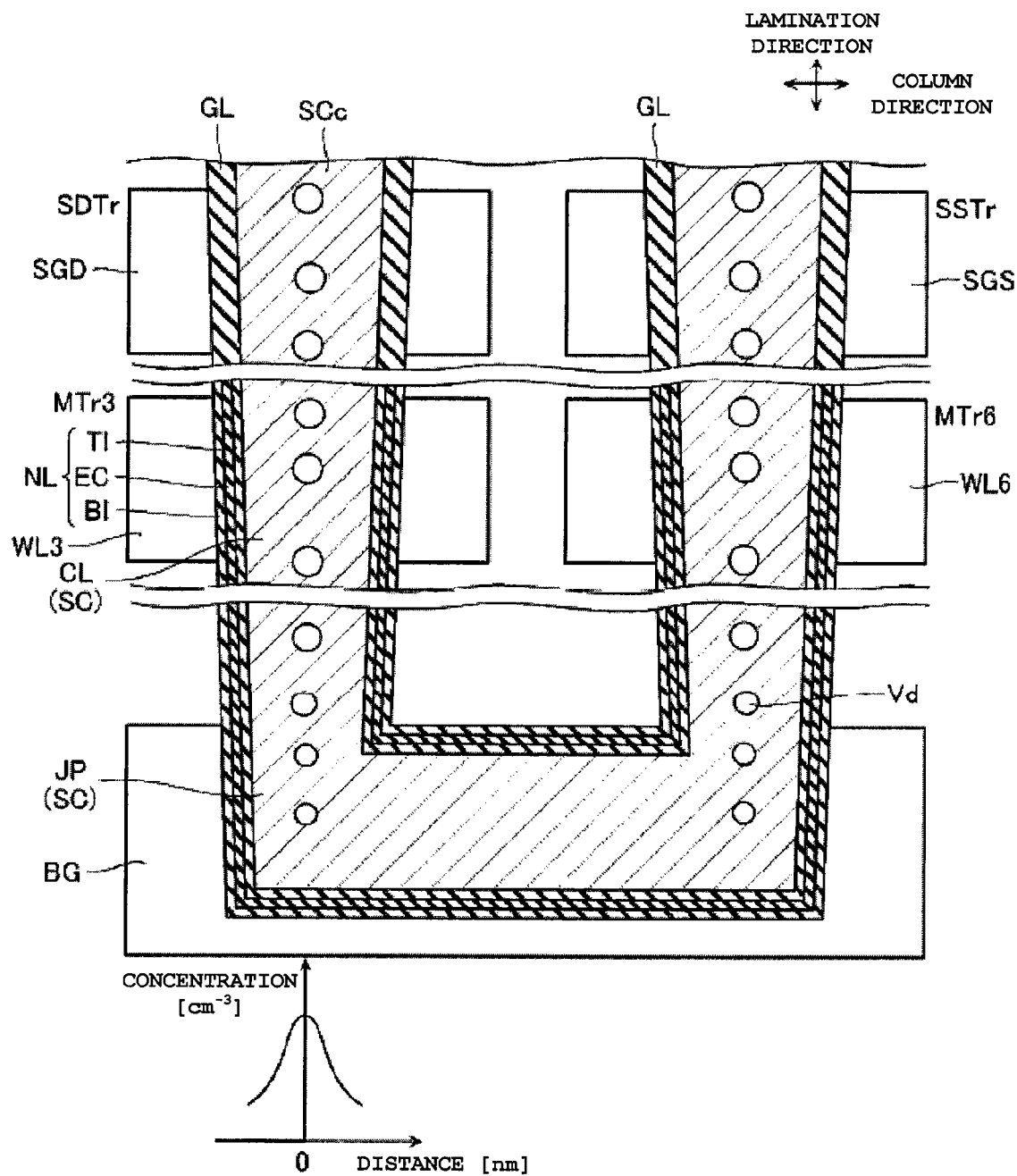
FIG. 15 is a partially enlarged view of the memory string in the nonvolatile semiconductor storage device 100 according to a second embodiment.

In the following, the nonvolatile semiconductor storage device according to the second embodiment of the present invention will be explained with reference to FIG. 15. Because the configuration of this embodiment is the same as the first embodiment (FIG. 1 and FIG. 2), the detailed explanation is omitted. The second embodiment is different from the first embodiment in the structure of the U-shaped semiconductor SC.

The U-shaped semiconductor SC in the second embodiment is different from the U-shaped semiconductor SC in the first embodiment in that it is formed by a single third semiconductor layer SCc. The third semiconductor layer SCc is doped with carbon (C), oxygen (O), or nitrogen (N) in the same way as the second semiconductor layer SCb in the first embodiment. In other words, the second embodiment is different from the first embodiment in that it does not have a semiconductor layer equivalent to the first semiconductor layer SCa in which the concentration of carbon (C), oxygen (O), or nitrogen (N) is low.

Even if the U-shaped semiconductor SC includes a single third semiconductor layer SCc doped with carbon (C), oxygen (O), or nitrogen (N) as described in this embodiment, the movement of the void Vd is restrained. The same effect as the effect of the first embodiment can be realized. It is possible to guarantee the essential carrier mobility by appropriately adjusting the concentration of carbon (C) or similar.

In the second embodiment, in the case of carrying out CVD for depositing the single third semiconductor layer SCc, it is preferable to use a gas mixture of monosilane gas and monomethyl silane gas as the process gas to gradually increase the proportion of the latter. In this way, the concentration of carbon (C) or similar reaches the highest level near the center of the cross section perpendicular to the length direction of the third semiconductor layer SCc and has a concentration gradient that gradually decreases toward the peripheral part. Thus, the concentration of carbon or similar is at a minimum near the ONO film NL (the memory gate insulating film). In this way, it is possible to guarantee the carrier mobility and effectively restrain the movement of the voids.

(Third Embodiment)

Figure 16:
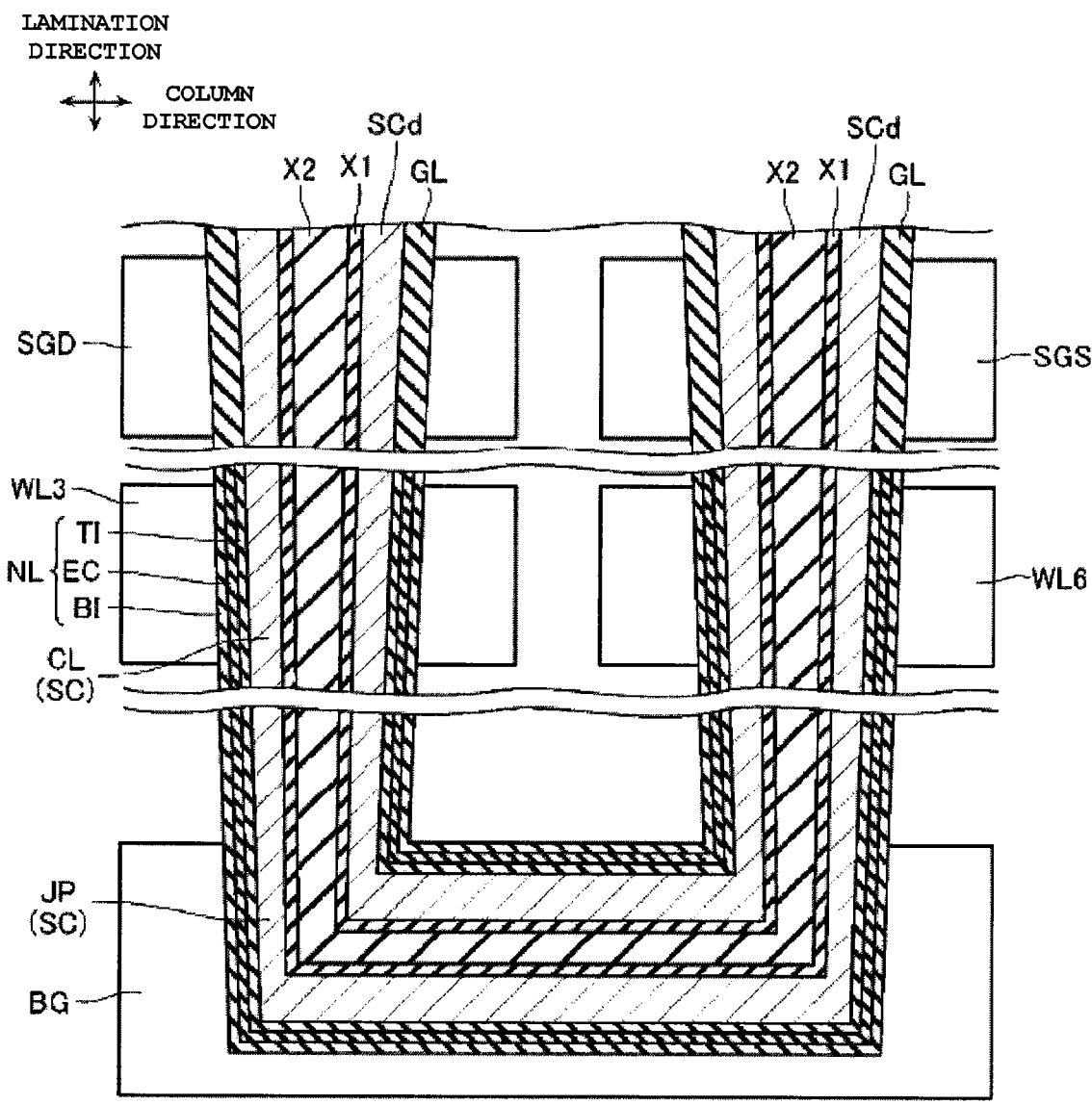
FIG. 16 is a partially enlarged view of the memory string in the nonvolatile semiconductor storage device 100 according to a third embodiment.

In the following section, the nonvolatile semiconductor storage device according to the third embodiment of the present invention will be explained with reference to FIG. 16. Because the entire configuration of this embodiment is the same as the configuration the first embodiment (FIG. 1 and FIG. 2), the detailed explanation is omitted. The third embodiment is different from the first embodiment in the structure of the U-shaped semiconductor SC.

The U-shaped semiconductor SC in the third embodiment is different from the U-shaped semiconductor SC in the first embodiment in that it is formed by a single fourth semiconductor layer SCd. The fourth semiconductor layer SCd is formed appropriately to have contact with the ONO film NL and have the void therein in the same way as the first semiconductor layer SCa in the first embodiment. Then, a silicon oxide film X1 is formed on the inner side of the fourth semiconductor layer SCd. The silicon oxide film X1 is formed by thermally oxidizing the fourth semiconductor layer SCd. Also, a silicon nitride film 2 is buried on the opposite side of the silicon oxide film X1. The silicon nitride film X2 can also be omitted to leave it as a void.

In the following, the fabrication method of this embodiment will be explained with reference to FIG. 17 through FIG. 19. In this case, only the method for forming the fourth semiconductor layer SCd, the silicon oxide film X1, and the silicon nitride film X2 will be explained. The fabrication method of the rest of the structure is the same as fabrication method of the first embodiment (FIG. 6 through FIG. 14).

Figure 17:
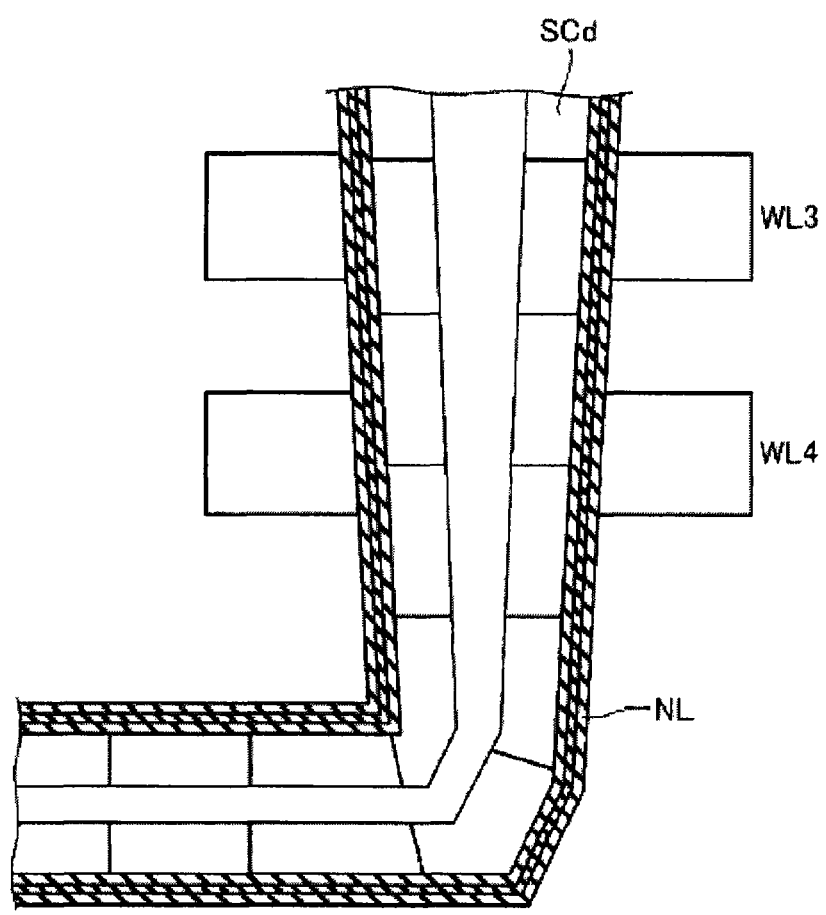
FIG. 17 is a process diagram illustrating the fabrication method of the nonvolatile semiconductor storage device 100 according to the third embodiment.

First, as shown in FIG. 17, amorphous silicon used as the material of the fourth semiconductor layer SCd is deposited along the inner wall of the memory hole and the back gate hole via the ONO film NL. The deposited film has a thickness such that it does not close off the memory hole and the back gate hole. After that, a heat treatment is carried out to convert the amorphous silicon into polysilicon. The fourth semiconductor layer SCd at that time is thicker than the fourth semiconductor layer SCd in the final structure. The size (average value) of the particles of the polysilicon tends to increase as the thickness of the polysilicon to be deposited is increased.

Figure 18:
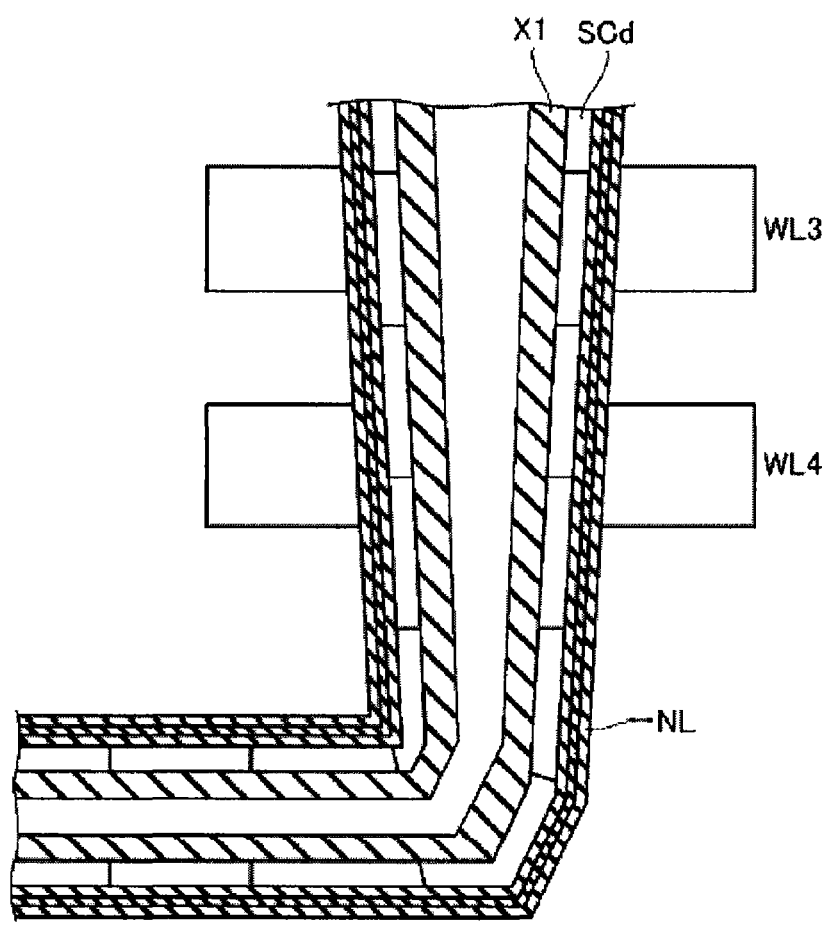
FIG. 18 is a process diagram illustrating the fabrication method of the nonvolatile semiconductor storage device 100 according to the third embodiment.
Figure 19:
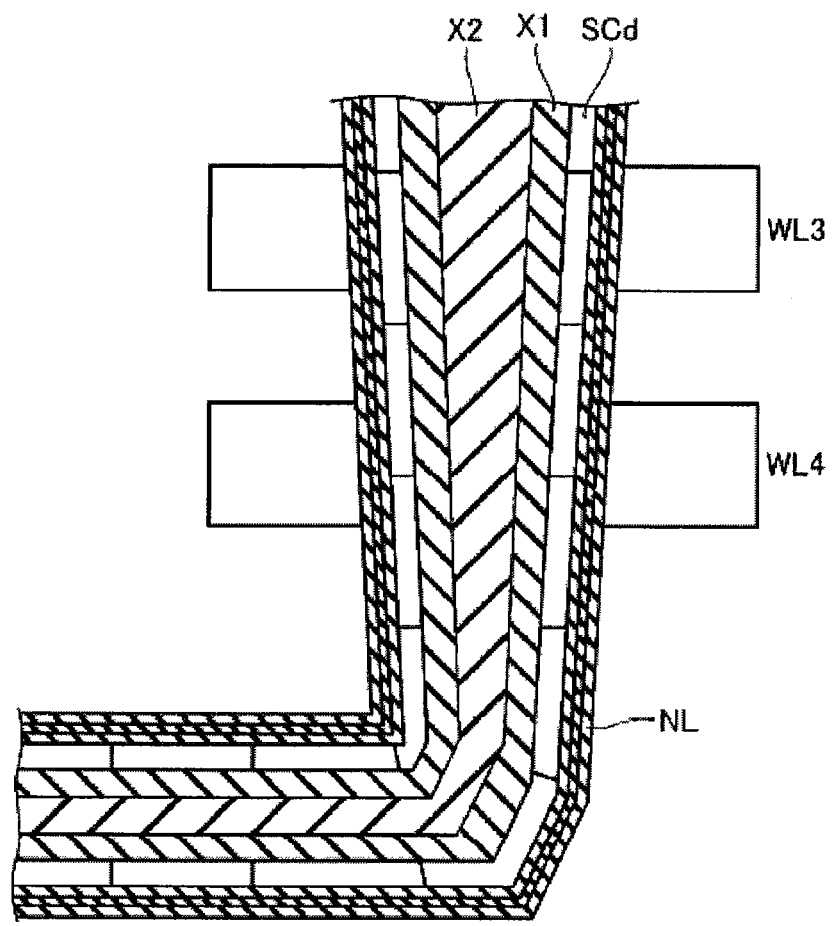
FIG. 19 is a process diagram illustrating the fabrication method of the nonvolatile semiconductor storage device 100 according to the third embodiment.

Then, as shown in FIG. 18, thermal oxidation is carried out to oxidize the surface of the fourth semiconductor layer SCd to form the silicon oxide film X1. When part of the fourth semiconductor layer SCd with a thickness t1 (for example, half of the thickness t1/2) is oxidized, a silicon oxide film X1 with a thickness (t1/2)/0.44 is formed, and the fourth semiconductor layer SCd with a thickness ½×t1 is left. After that, as shown in FIG. 19, the silicon nitride film X2 is deposited in the remaining void.

According to this embodiment, part of the fourth semiconductor layer SCd is oxidized to form the silicon oxide film X1. The mobility of the carrier can be increased by adopting this configuration.

As described above, the average particle size of the polysilicon increases as the thickness of the film to be deposited is increased. In the case of using polysilicon as the material to form the U-shaped semiconductor SC, a large average particle size of polysilicon is preferred. For polysilicon, a trap level may be formed on the grain boundary, and this trap level will lower the carrier mobility. However, when the average particle size is large, the number of the trap levels becomes small, and the carrier mobility can be increased correspondingly.

Therefore, in this embodiment, polysilicon is first deposited more thickly than the fourth semiconductor layer SCd in the final structure of the fabrication process. In this case, the particle size of polysilicon can be increased compared with the case of depositing the fourth semiconductor layer in the thickness required in the final structure from the beginning. In other words, the carrier mobility can be improved.

Then, the surface of the polysilicon is thermally oxidized to reduce the thickness of the fourth semiconductor layer SCd to the desired thickness. In this way, part of the grain boundary of polysilicon is changed to the silicon oxide film. The trap level is further reduced. Consequently, the carrier mobility can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed:

1. A nonvolatile semiconductor storage device, comprising:
    a memory string in which a plurality of electrically rewritable memory cells are connected in series in a first direction orthogonal to a plane of a substrate,
    the memory string comprising:
        word-line layers separated by interlayer insulating layers in the first direction,
        a through hole that penetrates through the word-line layers and the interlayer insulating layers in the first direction,
        an insulating film formed on an inner wall of the through hole, the insulating film having a charge accumulation layer, and
        a columnar semiconductor layer formed on the insulating film in the through hole, the columnar semiconductor layer having a first semiconductor layer formed on the insulating film in the through hole and a second semiconductor layer formed on the first semiconductor layer in the through hole, the second semiconductor layer having at least one void therein.

2. The nonvolatile semiconductor storage device of claim 1, wherein the first semiconductor layer is formed of silicon and the second semiconductor layer is formed of silicon with a dopant.

3. The nonvolatile semiconductor storage device of claim 1, wherein the second semiconductor layer is formed of silicon doped with carbon.

4. The nonvolatile semiconductor storage device of claim 1, wherein the second semiconductor layer is configured to prevent migration of the void therein.

5. The nonvolatile memory of claim 4, wherein the insulating film is a gate insulator film.

6. The nonvolatile semiconductor storage device of claim 1, wherein the void is formed as an unwanted consequence of the deposition process of the second semiconductor layer.

7. The nonvolatile semiconductor storage device of claim 1, wherein the first and the second semiconductor layers are deposited by a chemical vapor deposition process.

8. The nonvolatile semiconductor storage device of claim 7, wherein a dopant is introduced during the deposition process after the first semiconductor layer is deposited.

9. A nonvolatile semiconductor storage device, comprising:
   a memory string in which electrically rewritable memory cells are connected in series in a first direction orthogonal to a plane of a substrate,
   the memory string comprising:
      a plurality of word-line layers separated by interlayer insulating layers in the first direction,
      a through hole that penetrate through the word-line layers and the interlayer insulating layers in the first direction,
      an insulating film formed on an inner wall of the through hole, the insulating film having a charge accumulation layer, and
      a columnar semiconductor layer formed on the insulating film inside the through hole; wherein
   the columnar semiconductor layer contains carbon or nitrogen.

10. The nonvolatile semiconductor storage device according to claim 9, wherein
   a concentration of carbon or nitrogen in a central portion of a cross section of the columnar semiconductor layer perpendicular to the first direction is higher than a concentration of carbon or nitrogen in a peripheral portion of the cross section of the columnar semiconductor layer perpendicular to the first direction.

11. The nonvolatile semiconductor storage device according to claim 9, wherein
   a concentration of carbon or nitrogen in a cross section of the columnar semiconductor layer perpendicular to the first direction has a gradient that increases from a peripheral portion of the cross section toward a central portion of the cross section.

12. The nonvolatile semiconductor storage device of claim 9, wherein the columnar semiconductor layer has a first semiconductor layer formed on the insulating film and a second semiconductor layer formed on the first semiconductor layer, a concentration of carbon or nitrogen of the second semiconductor layer being higher than a concentration of carbon or nitrogen of the first semiconductor layer.

13. The nonvolatile semiconductor storage device of claim 12, wherein the second semiconductor layer has at least one void therein.

14. The nonvolatile semiconductor storage device of claim 9, wherein the columnar semiconductor layer has an outer layer and an inner layer, and the inner layer includes a dopant therein.

* * * * *